(12) United States Patent
Forbes

(10) Patent No.: US 7,737,536 B2
(45) Date of Patent: Jun. 15, 2010

(54) CAPACITIVE TECHNIQUES TO REDUCE NOISE IN HIGH SPEED INTERCONNECTIONS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 11/458,155

(22) Filed: Jul. 18, 2006

(65) Prior Publication Data

US 2006/0244108 A1    Nov. 2, 2006

Related U.S. Application Data

(62) Division of application No. 10/930,158, filed on Aug. 31, 2004, which is a division of application No. 10/060,801, filed on Jan. 30, 2002, now Pat. No. 7,101,770.

(51) Int. Cl.
*H01L 29/40* (2006.01)
(52) U.S. Cl. .................. 257/662; 257/531; 257/532; 257/535; 257/758; 257/664; 257/637; 257/E21.16; 257/E21.019; 257/E23.018; 257/E23.019
(58) Field of Classification Search .................. 257/531, 257/532, 535, 758, E23, E21.06, E21.019, 257/E23.018, E23.019, 662, 664, 637
See application file for complete search history.

(56) References Cited

U.S. PATENT DOCUMENTS

| | | | |
|---|---|---|---|
| 3,478,230 A | 11/1969 | Otter, Jr. et al. | |
| 3,676,718 A | 7/1972 | Anderson et al. | |
| 3,743,550 A | 7/1973 | Masumoto et al. | |
| 3,816,673 A | 6/1974 | Miya | |
| 3,923,567 A | 12/1975 | Lawrence | |
| 3,959,047 A | 5/1976 | Alberts et al. | |
| 3,982,268 A | 9/1976 | Anthony et al. | |
| 4,081,701 A | 3/1978 | White, Jr. et al. | |
| 4,308,421 A | 12/1981 | Bogese, II | |
| 4,339,305 A | 7/1982 | Jones | |

(Continued)

FOREIGN PATENT DOCUMENTS

JP    4-133472    5/1992

(Continued)

OTHER PUBLICATIONS

Arnoldussen, Thomas C., "A Modular Transmission Line/Reluctance Head Model", *IEEE Transactions on Magnetics*, 24, (Nov. 1988),2482-2484.

(Continued)

*Primary Examiner*—Wael Fahmy
*Assistant Examiner*—Marc Armand
(74) *Attorney, Agent, or Firm*—Schwegman, Lundberg & Woessner, P.A.

(57) ABSTRACT

Structures, in various embodiments, are provided using capacitive techniques to reduce noise in high speed interconnections, such as in CMOS integrated circuits. In an embodiment, a transmission line is disposed on a first layer of insulating material, where the first layer of insulating has a thickness equal to or less than 1.0 micrometer. The transmission line may be structured with a thickness and a width of approximately 1.0 micrometers. A second layer of insulating material is disposed on the transmission line.

32 Claims, 10 Drawing Sheets

U.S. PATENT DOCUMENTS

| | | | |
|---|---|---|---|
| 4,372,032 A | 2/1983 | Collins et al. | |
| 4,394,712 A | 7/1983 | Anthony | |
| 4,595,428 A | 6/1986 | Anthony et al. | |
| 4,601,021 A | 7/1986 | Paul et al. | |
| 4,631,636 A | 12/1986 | Andrews | |
| 4,640,871 A | 2/1987 | Hayashi et al. | |
| 4,653,025 A | 3/1987 | Minato et al. | |
| 4,710,798 A | 12/1987 | Marcantonio | |
| 4,713,841 A | 12/1987 | Porter et al. | |
| 4,739,446 A | 4/1988 | Landis | |
| 4,749,888 A | 6/1988 | Sakai et al. | |
| 4,870,470 A | 9/1989 | Bass, Jr. et al. | |
| 4,933,743 A | 6/1990 | Thomas et al. | |
| 4,962,476 A | 10/1990 | Kawada | |
| 4,977,439 A | 12/1990 | Esquivel et al. | |
| 4,994,688 A * | 2/1991 | Horiguchi et al. | 327/541 |
| 5,019,728 A | 5/1991 | Sanwo et al. | |
| 5,061,987 A | 10/1991 | Hsia | |
| 5,073,771 A | 12/1991 | Satta et al. | |
| 5,079,618 A | 1/1992 | Farnworth | |
| 5,128,962 A | 7/1992 | Kerslake et al. | |
| 5,135,889 A | 8/1992 | Allen | |
| 5,153,814 A | 10/1992 | Wessely | |
| 5,157,361 A | 10/1992 | Gruchalla et al. | |
| 5,165,046 A | 11/1992 | Hesson | |
| 5,168,334 A | 12/1992 | Mitchell et al. | |
| 5,223,808 A | 6/1993 | Lee et al. | |
| 5,229,327 A | 7/1993 | Farnworth | |
| 5,258,648 A | 11/1993 | Lin | |
| 5,258,658 A | 11/1993 | Morikawa | |
| 5,275,001 A | 1/1994 | Yokotani et al. | |
| 5,295,132 A * | 3/1994 | Hashimoto et al. | 370/242 |
| 5,313,361 A | 5/1994 | Martin | |
| 5,317,197 A | 5/1994 | Roberts | |
| 5,343,366 A | 8/1994 | Cipolla et al. | |
| 5,352,998 A | 10/1994 | Tanino | |
| 5,357,138 A | 10/1994 | Kobayashi | |
| 5,362,976 A | 11/1994 | Suzuki | |
| 5,363,550 A | 11/1994 | Aitken et al. | |
| 5,391,917 A | 2/1995 | Gilmour et al. | |
| 5,392,407 A | 2/1995 | Heil et al. | |
| 5,409,547 A | 4/1995 | Watanabe et al. | |
| 5,415,699 A | 5/1995 | Harman | |
| 5,432,823 A | 7/1995 | Gasbarro et al. | |
| 5,438,224 A | 8/1995 | Papageorge et al. | |
| 5,450,026 A | 9/1995 | Morano | |
| 5,468,681 A | 11/1995 | Pasch | |
| 5,510,758 A | 4/1996 | Fujita et al. | |
| 5,521,536 A | 5/1996 | Yamashita et al. | |
| 5,532,506 A | 7/1996 | Tserng | |
| 5,567,654 A | 10/1996 | Beilstein, Jr. et al. | |
| 5,574,923 A | 11/1996 | Heeb et al. | |
| 5,587,119 A | 12/1996 | White | |
| 5,598,031 A | 1/1997 | Groover et al. | |
| 5,598,039 A | 1/1997 | Weber | |
| 5,610,366 A | 3/1997 | Fleurial et al. | |
| 5,618,752 A | 4/1997 | Gaul | |
| 5,619,159 A | 4/1997 | Sasaki et al. | |
| 5,622,875 A | 4/1997 | Lawrence | |
| 5,633,962 A | 5/1997 | Kurata | |
| 5,637,828 A | 6/1997 | Russell et al. | |
| 5,646,067 A | 7/1997 | Gaul | |
| 5,656,548 A | 8/1997 | Zavracky et al. | |
| 5,657,481 A | 8/1997 | Farmwald et al. | |
| 5,663,596 A | 9/1997 | Little | |
| 5,682,062 A | 10/1997 | Gaul | |
| 5,692,558 A | 12/1997 | Hamilton et al. | |
| 5,699,291 A | 12/1997 | Tsunemine | |
| 5,714,791 A | 2/1998 | Chi et al. | |
| 5,729,047 A | 3/1998 | Ma | |
| 5,747,728 A | 5/1998 | Fleurial et al. | |
| 5,753,529 A | 5/1998 | Chang et al. | |
| 5,767,001 A | 6/1998 | Bertagnolli et al. | |
| 5,772,153 A | 6/1998 | Abaunza et al. | |
| 5,781,746 A | 7/1998 | Fleck | |
| 5,786,628 A | 7/1998 | Beilstein, Jr. et al. | |
| 5,807,783 A | 9/1998 | Gaul et al. | |
| 5,811,984 A | 9/1998 | Long et al. | |
| 5,821,624 A | 10/1998 | Pasch | |
| 5,834,799 A | 11/1998 | Rostoker et al. | |
| 5,837,618 A | 11/1998 | Avanzino et al. | |
| 5,855,735 A | 1/1999 | Takada et al. | |
| 5,861,666 A | 1/1999 | Bellaar | |
| 5,872,393 A | 2/1999 | Sakai et al. | |
| 5,880,601 A | 3/1999 | Kanazawa et al. | |
| 5,901,050 A | 5/1999 | Imai | |
| 5,902,118 A | 5/1999 | Hubner | |
| 5,903,018 A | 5/1999 | Shimawaki | |
| 5,903,045 A | 5/1999 | Bertin et al. | |
| 5,910,684 A | 6/1999 | Sandhu et al. | |
| 5,915,167 A | 6/1999 | Leedy | |
| 5,990,550 A | 11/1999 | Umezawa | |
| 5,990,564 A | 11/1999 | Degani et al. | |
| 5,991,161 A | 11/1999 | Samaras et al. | |
| 6,016,256 A | 1/2000 | Crane, Jr. et al. | |
| 6,022,787 A | 2/2000 | Ma | |
| 6,075,383 A | 6/2000 | Terletski | |
| 6,133,621 A | 10/2000 | Gaibotti et al. | |
| 6,137,164 A | 10/2000 | Yew et al. | |
| 6,143,616 A | 11/2000 | Geusic et al. | |
| 6,161,215 A | 12/2000 | Hollenbeck et al. | |
| 6,181,004 B1 * | 1/2001 | Koontz et al. | 257/691 |
| 6,219,237 B1 | 4/2001 | Geusic et al. | |
| 6,223,273 B1 | 4/2001 | Kanekawa et al. | |
| 6,225,935 B1 * | 5/2001 | Sterzer et al. | 341/155 |
| 6,226,599 B1 | 5/2001 | Namiki | |
| 6,242,796 B1 * | 6/2001 | Sim et al. | 257/664 |
| 6,255,852 B1 | 7/2001 | Forbes et al. | |
| 6,281,042 B1 | 8/2001 | Ahn et al. | |
| 6,350,649 B1 | 2/2002 | Jeong et al. | |
| 6,373,674 B1 | 4/2002 | Sugiura et al. | |
| 6,373,740 B1 | 4/2002 | Forbes et al. | |
| 6,388,198 B1 | 5/2002 | Bertin et al. | |
| 6,414,476 B2 | 7/2002 | Yagi | |
| 6,420,778 B1 | 7/2002 | Sinyansky | |
| 6,433,408 B1 * | 8/2002 | Anjo et al. | 257/664 |
| 6,452,759 B2 * | 9/2002 | Urai | 360/318 |
| 6,545,338 B1 | 4/2003 | Bothra et al. | |
| 6,555,858 B1 | 4/2003 | Jones et al. | |
| 6,569,757 B1 | 5/2003 | Weling et al. | |
| 6,570,248 B1 | 5/2003 | Ahn et al. | |
| 6,600,339 B2 | 7/2003 | Forbes et al. | |
| 6,603,080 B2 | 8/2003 | Jensen | |
| 6,603,465 B1 | 8/2003 | Hashimoto et al. | |
| 6,674,167 B1 | 1/2004 | Ahn et al. | |
| 6,692,898 B2 | 2/2004 | Ning | |
| 6,737,887 B2 | 5/2004 | Forbes et al. | |
| 6,764,941 B2 | 7/2004 | Yang et al. | |
| 6,787,888 B2 | 9/2004 | Forbes et al. | |
| 6,787,906 B1 | 9/2004 | Yang et al. | |
| 6,794,735 B2 | 9/2004 | Forbes et al. | |
| 6,815,804 B2 | 11/2004 | Forbes | |
| 6,833,317 B2 | 12/2004 | Forbes et al. | |
| 6,844,256 B2 | 1/2005 | Forbes et al. | |
| 6,846,738 B2 | 1/2005 | Forbes et al. | |
| 6,852,613 B2 | 2/2005 | Forbes et al. | |
| 6,884,706 B2 | 4/2005 | Forbes et al. | |
| 6,900,116 B2 | 5/2005 | Forbes et al. | |
| 6,903,003 B2 | 6/2005 | Forbes et al. | |
| 6,903,444 B2 | 6/2005 | Forbes et al. | |
| 6,906,402 B2 | 6/2005 | Forbes et al. | |
| 6,914,278 B2 | 7/2005 | Forbes et al. | |
| 7,101,778 B2 | 9/2006 | Forbes et al. | |
| 7,154,354 B2 | 12/2006 | Akram et al. | |

| | | | |
|---|---|---|---|
| 7,235,457 B2 | 6/2007 | Forbes et al. | |
| 7,327,016 B2 | 2/2008 | Forbes et al. | |
| 7,335,968 B2 | 2/2008 | Forbes | |
| 7,375,414 B2 | 5/2008 | Forbes et al. | |
| 7,391,637 B2 | 6/2008 | Forbes et al. | |
| 7,483,286 B2 | 1/2009 | Forbes et al. | |
| 7,554,829 B2 | 6/2009 | Forbes et al. | |
| 7,602,049 B2 | 10/2009 | Forbes | |
| 2001/0000428 A1 | 4/2001 | Abadeer et al. | |
| 2001/0017577 A1* | 8/2001 | Toko et al. | 333/161 |
| 2002/0084514 A1* | 7/2002 | Maetani | 257/662 |
| 2002/0145901 A1 | 10/2002 | Forbes et al. | |
| 2003/0015707 A1 | 1/2003 | Bosco et al. | |
| 2003/0128494 A1 | 7/2003 | Birecki et al. | |
| 2003/0173652 A1 | 9/2003 | Forbes et al. | |
| 2003/0173653 A1 | 9/2003 | Forbes et al. | |
| 2003/0176023 A1 | 9/2003 | Forbes et al. | |
| 2003/0176025 A1 | 9/2003 | Forbes et al. | |
| 2003/0176050 A1 | 9/2003 | Forbes et al. | |
| 2003/0176052 A1 | 9/2003 | Forbes et al. | |
| 2003/0176053 A1 | 9/2003 | Forbes et al. | |
| 2005/0006727 A1 | 1/2005 | Forbes et al. | |
| 2005/0007817 A1 | 1/2005 | Forbes et al. | |
| 2005/0017327 A1 | 1/2005 | Forbes et al. | |
| 2005/0030803 A1 | 2/2005 | Forbes et al. | |
| 2005/0140462 A1 | 6/2005 | Akram et al. | |
| 2006/0131702 A1 | 6/2006 | Forbes et al. | |
| 2006/0261438 A1 | 11/2006 | Forbes | |
| 2006/0261448 A1 | 11/2006 | Forbes et al. | |
| 2007/0029645 A1 | 2/2007 | Forbes et al. | |
| 2007/0045817 A1 | 3/2007 | Forbes et al. | |
| 2009/0207641 A1 | 8/2009 | Forbes et al. | |

FOREIGN PATENT DOCUMENTS

| | | |
|---|---|---|
| JP | 05-129666 | 5/1993 |
| WO | WO-94/05039 | 3/1994 |

OTHER PUBLICATIONS

Beddingfield, C., et al., "Flip Chip Assembly of Motorola Fast Static RAM Known Good Die", *1997 Proceedings, 47th Electronic Components and Technology Conference*, San Jose, CA,(May 18-21, 1997),643-648.

Blalock, T. N., et al., "A High-Speed Clamped Bit-Line Current-Mode Sense Amplifier", *IEEE Journal of Solid-State Circuits*, 26(4), (Apr. 1991),542-548.

Blalock, T. N., et al., "A High-Speed Clamped Bit-Line Current-Mode Sense Amplifier", *IEEE Journal of Solid-State Circuits*, 26(4), (Apr. 1991),pp. 542-548.

Blalock, Travis N., et al., "A High-speed Sensing Scheme for 1T Dynamic RAMs Utilizing the Clamped Bit-line Sense Amplifier", *IEEE Journal of Solid-State Circuits*, 27(4), (Apr. 1992),618-625.

Cao, L., "A Novel "Double-Decker" Flip-Chip/BGA Package for Low Power Giga-Hertz Clock Distribution", *1997 Proceedings, 47th Electronic Components and Technology Conference*, San Jose, CA,(May 18-21, 1997),1152-1157.

Crisp, R., "Development of Single-Chip Multi-GB/s DRAMs", *Digest of International Solid-State Circuits Conference*, (1997),226-227.

Crisp, R., "Rambus Technology, the Enabler", *Conference Record of WESCON*, Anaheim, CA,(Nov. 17-19, 1992),160-165.

Demmin, J., "nCHIP's Silicon Circuit Board Technology", *National Electronic Packaging and Production Conference, NEPCON West 94*, 3, Proceedings of the Technical Program,(1993),2038-9.

Donnelly, K. S., et al., "A 660MB/s Interface Megacell Portable Circuit in—.3 im-0.7 im CMOS ASIC", *IEEE Journal of Solid-State Circuits*, vol. 32,(Dec. 1996),1995-2003.

Emeigh, R., et al., "Fully Integrated LVD Clock Generation/Distribution IC", *IEEE Custom Integrated Circuits Conference*, Santa Clara,(1997),pp. 53-56.

Feinberg, I., et al., "Interposer for Chip-on-Chip Module Attachment", *IBM Technical Disclosure Bulletin*, 26(9), (Feb. 1984),4590-91.

Foster, R., et al., "High Rate Low-Temperature Selective Tungsten", In: *Tungsten and Other Refractory Metals for VLSI Applications III*, V.A. Wells, ed., Materials Res. Soc., Pittsburgh, PA,(1988),69-72.

Gabara, T. J., et al., "Digitally Adjustable Resistors in CMOS for High-Performance Applications", *IEEE Journal of Solid-State Circuits*, 27(8), (1992),1176-1185.

Goodman, T., et al., "The Flip Chip Market", *Advanced Packaging*, (Sep./Oct. 1997),24-25.

Gray, P. R., et al., "Analysis and Design of Analog and Integrated Circuits", *John Wiley and Sons, 2nd ed.*, (1984),617-622.

Gunning, B., et al., "A CMOS Low-Voltage-Swing Transmission-Line Transceiver", *Digest of Technical Papers—IEEE International Solid State Circuits Conference*, San Francisco, CA,(1992),pp. 58-59.

Heremans, P, et al., "Optoelectronic Integrated Receiver for Inter-MCM and Inter-Chip Optical Interconnects", *Technical Digest, International Electron Devices Meeting*, (Dec. 1996),657-660.

Horie, Hiroshi, et al., "Novel High Aspect Ratio Aluminum Plug for Logic/DRAM LSI's Using Polysilicon-Aluminum Substitute", *Technical Digest: IEEE International Electron Devices Meeting*, San Francisco, CA,(1996),946-948.

Horowitz, M., et al., "PLL Design for a 500mbs Interface", *Dig. International Solid-State Circuits Conference*, (1993), 160-161.

Hsu, Yimin, et al., "High frequency high field permeability of patterned $Ni_{80}Fe_{20}$ and $Ni_{45}Fe_{55}$ thin films", *Journal of Applied Physics*, 89(11), (Jun. 1, 2001),6808-6810.

Hsu, et al., "Low temperature fired NiCuZn ferrite", *IEEE Transactions on Magnetics*, 30 (6), (1994),4875-4877.

Huth, N., "Next-Generation Memories", *Electronik*, 42(23), (1993),36-44.

Johnson, H. W., et al., "High Speed Digital Design", *A Handbook of Black Magic*, Prentice Hall PTR, Upper Saddle River, New Jersey,(1993),pp. 422 & 426.

Johnson, H., "In: High Speed Digital Designs: A Handbook of Black Magic", *Prentice-Hall, Inc., New Jersey, ISBN 0-13-395724-1*, (1993),66-71, 194-197.

Krishnamoorthy, A. V., et al., "Ring Oscillators with Optical and Electrical Readout Based on Hybrid GaAs MQW Modulators Bonded to 0.8 Micron Silicon VLSI Cricuits", *Electronics Lett. 31(22)*, (Oct. 26, 1995),1917-18.

Lee, T. H., et al., "A 2.5V Delay-Locked Loop for an 18Mb 500MB/s DRAM", *Digest of International Solid-State Circuits Conference*, (1994),300-301.

Lee, K., et al., "Modeling and Analysis of Multichip Module Power Supply Planes", *IEEE Tranactions on Components, Packaging, and Manufacturing Technology*, vol. 18, No. 4, (1995),pp. 628-639.

Lee, K., "On-Chip interconnects—gigahertz and beyond", *Solid-State Technology*, (1998),pp. 85-88.

Lehmann, V., "The Physics of Macropore Formation in Low Doped n-Type Silicon", *Journal of the Electrochemical Society*, 140(10), (Oct. 1993),2836-2843.

Lin, C. M., et al., "Precision Embedded Thin Film Resistors for Multichip Modules (MCM-D)", *Proceedings IEEE Multichip Module Conference*, (1997),44-9.

Mimura, T., et al., "System Module: a New Chip-on-Chip Module Technology", *Proceedings of 1997 IEEE Custom Integrated Circuit Conference*, (1997),439-442.

Muller, K., et al., "Trench Storage Node Technology of Gigabit DRAM Generations", *Digest IEEE International Electron Devices Meeting*, San Francisco, CA,(Dec. 1996),507-510.

Ohba, T., et al., "Evaluation on Selective Deposition of CVD W Films by Measurement of Surface Temperature", In: *Tungsten and Other Refractory Metals for VLSI Applications II*, Materials Research Society, Pittsburgh, PA,(1987),59-66.

Ohba, T., "Selective Chemical Vapor Deposition of Tungsten Using Silane and Polysilane Reductions", In: *Tungsten and Other Refractory Metals for VLSI Applications IV*, Materials Research Society, Pittsburgh, PA,(1989), 17-25.

Patel, N. G., et al., "Thermoelectric Cooling Effect in a $p-Sb_2Te_3$-n-$Bi_2Te_3$ Thin Film Thermocouple", *Solid-State Electronics 35(9)*, (1992),1269-72.

Rabaey, J. M., *Digital Integrated Circuits, A Design Perspective*, Prentice Hall, Upper Saddle River, New Jersey, ISBN 0-13-178609-1,(1996),pp. 482-493.

Ramo, S. , "Fields and Waves in Communication Electronics", *John Wiley & Sons, Inc., New York, 3rd ed.*, (1994),pp. 428-433.

Rucker, T. G., et al., "A High Performance SI and SI Multichip Module Technology", *1992 Symposium on VLSI Technology, Digest of Technical Papers, IEEE*, Japanese Society of Applied Physics, 1992 Seattle, WA,(Jun. 2-4, 1992),72-73.

Seevinck, E., et al., "Current-Mode Techniques for High-Speed VLSI Circuits with Application to Current Sense Amplifier for CMOS SRAM's", *IEEE Journal of Solid State Circuits*, 26(4), (Apr. 1991),pp. 525-536.

Sekine, et al., "A New High-Density Plasma Etching System Using a Dipole-Ring Magnet", *Jpn. J. Appl. Phys.*, Pt. 1, Nov. 11, (Nov. 1995),6274-6278.

Sendra, M , "Permeability Measurement of Soft Magnetic Films at High Frequency and Multilayering Effect", *IEEE Translation Journal on Magnetics in Japan*, vol. 8, No. 3, (Mar. 1993),pp. 161-168.

Seraphim, D. P., et al., "Principles of Electronic Packaging.", In: *Principles of Electronic Packaging*, McGraw-Hill, New York, NY,(1989),44, 190, 595-597.

Shafai, C. , et al., "A Micro-Integrated Peltier Heat Pump for Localized On-chip Temperature Control.", *Canadian Journal of Physics*, 74, Suppl., No. 1, (1996),S139-142.

Shafai, C., et al., "Optimization of $Bi_2Te_3$ Thin Films for Microintegrated Peltier Heat Pumps", *Journal of Vacuum Science and Technology A, Second Series 15*, No. 5, Preliminary Program, 44th Natiional Symposium on the AVS, San Jose, CA,(Sep./Oct. 1997),2798-2801.

Su, D. K., et al., "Experimental Results and Modeling Techniques for Substrate Noise in Mixed-Signal Integrated Circuits", *IEEE Journal of Solid-State Circuits*, 28(4), (Apr. 1993),420-430.

Thomas, M. , et al., "VLSI Multilevel Micro-Coaxial Interconnects for High Speed Devices", *IEEE International Electron Devices Meeting*, (1990),55-58.

Vardaman, E. J., et al., "CSPs: Hot new packages for cool portable products", *Solid State Technology*, 40(10), (Oct. 1997),84-89.

Vendier, O. , et al., "155 Mbps Digital Transmitter Using GaAs Thin Film LEDs Bonded to Silicon Driver Circuits", *Digest IEEE/LEOS 1996 Summer Topical Meetings*, Advanced Applications of Lasers in Materials and Processing,(1996),15-16.

Vusirikala, V. , et al., "Flip-chip Optical Fiber Attachment to a Monolithic Optical Receiver Chip", *SPIE Proceedings (The International Society for Optical Engineering)*, 2613, (Oct. 24, 1995),52-58.

Webb, Bucknell C., "High-frequency permeability of laminated and unlaminated, narrow, thin-film magnetic stripes (invited)", *Journal of Applied Physics*, (1991),5611, 5613, 5615.

Webb, Bucknell C., et al., "The high field, high frequency permeability of narrow, thin-film magnetic stripes", *IEEE Transactions of Magnetics*, vol. 27,(1991),pp. 4876-4878.

Zhang, Hongguo , et al., "Investigation on Structure and Properties of Low-Temperature Sintered Composite Ferrites", *Materials Research Bulletin*, 35, (2000),2207-2215.

Zhenxing, Yue , et al., "Low Temperature Sinterable Cordicrite Glass-ceramics", *High Technology Letters (China)*, 10 (115), (2000),96-97.

\* cited by examiner

CAPACITIVE TECHNIQUES TO REDUCE NOISE IN HIGH SPEED INTERCONNECTIONS

CROSS REFERENCE TO RELATED APPLICATION

This application is a Divisional of U.S. Ser. No. 10/930,158 filed on Aug. 31, 2004, which is a Divisional of U.S. Ser. No. 10/060,801 filed on Jan. 30, 2002, now U.S. Pat. No. 7,101,770. These applications are herein incorporated by reference.

FIELD OF THE INVENTION

The present invention relates to integrated circuit devices, and more particularly, to methods and structures using capacitive techniques to reduce noise in high speed interconnections.

BACKGROUND OF THE INVENTION

The metal lines over insulators and ground planes, or metal lines buried in close proximity to dielectric insulators and used for integrated circuit interconnects are in reality transmission lines or strip lines. The use of coaxial interconnection lines for interconnections through the substrate in CMOS integrated circuits can also be termed transmission lines or strip lines. Interconnection lines on interposers or printed circuit boards can also be described as transmission lines.

The low characteristic impedance of any of these lines, transmission, strip lines or coaxial lines results in part from the low characteristic impedance of free space, $Zo=(\mu_o/\epsilon_o)^{1/2}=377$ ohms, and in part from the dielectric material used for electrical insulation in the lines which has a higher dielectric permittivity than free space. Most commonly used coaxial lines have an impedance of 50 ohms or 75 ohms, it is difficult to achieve larger values. In the past these effects have not received much consideration on the integrated circuits themselves since the propagation speed with oxide insulators is 15 cm/ns and switching speeds on integrated circuits of the size of a centimeter have been slower than $1/15$ ns or 70 picoseconds. Transmission line effects only become important if the switching time is of the same order as the signal propagation time. Switching times in CMOS circuits have been limited by the ability to switch the capacitive loads of long lines and buffers, and charge these capacitances over large voltage swings to yield a voltage step signal.

Most current CMOS integrated circuit interconnections rely on the transmission of a voltage step or signal from one location to another. FIG. 1 illustrates R-C limited, short high impedance interconnections with capacitive loads. The driver may simply be a CMOS inverter as shown in FIG. 1 and the receiver a simple CMOS amplifier, differential amplifier, or comparator.

As shown in FIG. 1, the CMOS receiver presents a high impedance termination or load to the interconnection line. This is problematic in that:

(i) the switching time response or signal delay is determined mainly by the ability of the driver to charge up the capacitance of the line and the load capacitance, (ii) the line is not terminated by its characteristic impedance resulting in reflections and ringing, (iii) large noise voltages may be induced on the signal transmission line due to capacitive coupling and large voltage swing switching on adjacent lines, the noise voltage can be a large fraction of the signal voltage.

The transmission of voltage step signals only works well if the interconnection line is short so that the stray capacitance of the line is small. Long lines result is slow switching speeds and excessive noise due to capacitive coupling between lines.

FIG. 1 shows the commonly used signal interconnection in CMOS integrated circuits, where voltage signals are transmitted from one location to another. This is problematic in that the interconnection lines are normally loaded with the capacitive input of the next CMOS stage and the large stray capacitance of the line itself. The response time is normally slow due to the limited ability of the line drivers to supply the large currents needed to charge these capacitances over large voltage swings. These times are usually much larger than the signal transmission time down the line so a lumped circuit model can be used to find the signal delay, as shown in FIG. 1.

In the example here the output impedance of the source follower is 1/gm=1000 ohms, and a line 0.1 cm long will have a capacitance of about 0.2 pF if the dimensions of the line are about 1 micron by 1 micron and the insulator or oxide thickness under the line is 1 micron. This results in a time constant of 200 pS and it takes about 400 pS to charge the line from 10% to 90% of the final voltage value. This is a relatively slow response.

Furthermore, if two interconnection wires are in close proximity then the voltage swing on one line can induce a large voltage swing or noise voltage on the adjacent line as shown in FIG. 1. The noise voltage is just determined by the capacitance ratios, or ratio of interwire capacitance, Cint, to the capacitance of the interconnection wire, C.

In prior art these can be comparable, as shown, and depend on the insulator thickness under the wires and the spacing between the wires. Therefore, the noise voltage can be a large fraction of the signal voltage if the wires are in close proximity and far removed from the substrate by being over thick insulators. The emphasis in prior art has always been in trying to minimize the capacitance of the interconnection line, C, by using thick insulators and low dielectric constant materials.

Thus, there is a need to provide a solution for these types of problems for CMOS-scaled integrated circuits. Due to the continued reduction in scaling and increases in frequency for transmission lines in integrated circuits such solutions remain a difficult hurdle. For these and other reasons there is a need to reduce noise in high speed interconnections.

DETAILED DESCRIPTION

Figure 1:
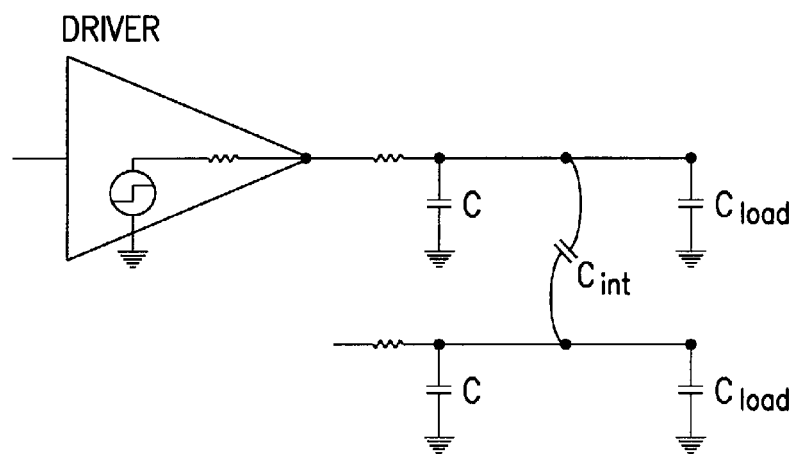
FIG. 1 shows the commonly used signal interconnection in CMOS integrated circuits, where voltage signals are transmitted from one location to another.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

One embodiment of the invention includes a method for forming transmission lines in an integrated circuit. The method include forming a first layer of electrically conductive material on a substrate. The method includes forming a first layer of insulating material on the first layer of the electrically conductive material. The first layer has a thickness of less than 1.0 micrometers (μm). A transmission line is formed on the first layer of insulating material. The transmission line has a thickness and a width of approximately 1.0 micrometers. A second layer of insulating material is formed on the transmission line. And, a second layer of electrically conductive material is formed on the second layer of insulating material.

Figure 2:
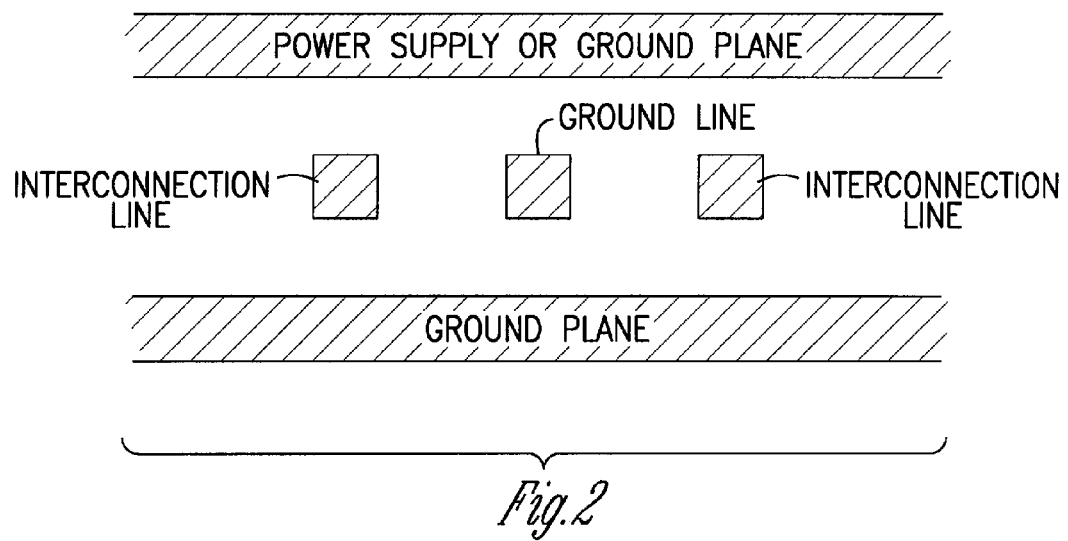
FIG. 2 illustrates one technique to minimize the interwire capacitance, Cint, by using an intermediate line at ground for shielding.

FIG. 2 illustrates one technique to minimize the interwire capacitance, Cint, by using an intermediate line at ground for shielding. This technique is disclosed in a co-pending application by a common inventor, Dr. Leonard Forbes, entitled "Novel Transmission Lines for CMOS Integrated Circuits," Ser. No. 09/364,199. The same is incorporated herein by reference.

Also, as disclosed in issued U.S. Pat. No. 6,255,852 by Dr. Leonard Forbes, entitled "Current Mode Signal Interconnects CMOS Amplifier," low impedance transmission lines such as those which exist on CMOS integrated circuits are more amenable to signal current interconnections over longer interconnection lines. U.S. Pat. No. 6,255,852 is incorporated herein by reference. These longer interconnection lines may be on the CMOS integrated circuit itself, an interconnection line between integrated circuits mounted in a module as for instance a memory module, an interposer upon which these integrated circuits are mounted, or on a printed circuit board upon which the integrated circuits are mounted. If the line is terminated with a low input impedance current sense amplifier then the line can be regarded as a transmission line terminated with the characteristic impedance of the interconnection line. This is advantageous in that:

(i) the signal delay depends only on the velocity of light on the line and is easily predictable and reproducible, eliminating or allowing for compensation for signal and/or clock skew, (ii) there are no reflections at the receiving end of the line and this minimizes ringing, (iii) noise signals will be smaller due to weaker coupling between lines resulting in better signal to noise ratios, the noise current will only be a small fraction of the signal current. The transmission of current signals rather than voltage signals is more desirable at high speeds, and in high speed or high clock rate circuits over longer interconnection lines. A CMOS circuit might for instance use a combination of techniques, conventional voltage signals over short interconnections with little coupling between lines and current signals over longer interconnections and where lines might be in close proximity.

Figure 3A:
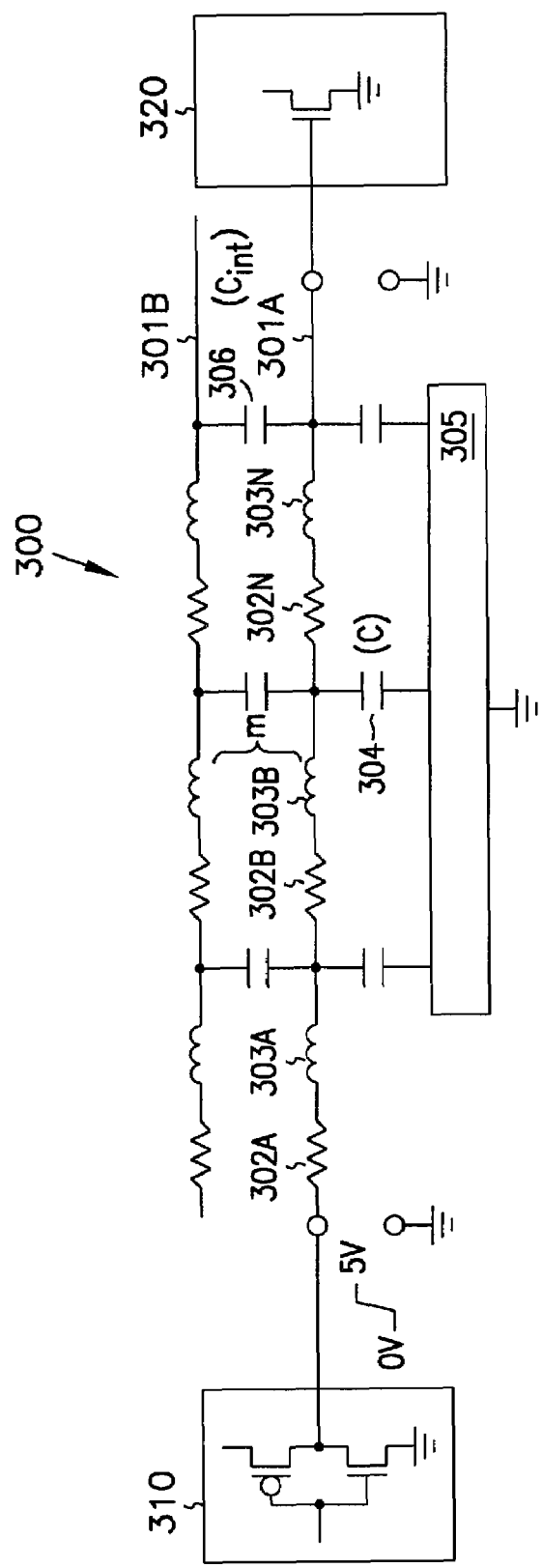
FIG. 3A illustrates signal transmission using correctly terminated transmission lines and current sense amplifiers, according to the teachings of the present invention.

FIG. 3A illustrates capacitive coupling between low impedance terminated interconnection lines. FIG. 3A illustrates signal transmission using correctly terminated transmission lines and current sense amplifiers, such as those disclosed in issued U.S. Pat. No. 6,255,852 by Dr. Leonard Forbes, entitled "Current Mode Signal Interconnects CMOS Amplifier." The signal interconnection or transmission line is terminated by the matching impedance of the current sense amplifier. This means the impedance looking into the sending end of the transmission line will just be the characteristic impedance of the line and the signal delay down the line will just be the small propagation delay down the line. The response time of the source follower being used as a line driver will be determined primarily by the longer rise time of the input voltage. This driver will supply a current whose rise time is basically just that of the input voltage. This driver will then supply a signal current whose rise time is basically just that of the input voltage signal.

FIG. 3A also illustrates the coupling to another signal line in close proximity, in this case the coupling will be both magnetic through the induced magnetic fields and mutual inductance and capacitive coupling. The noise current induced will be shown to be only a fraction of the signal current or the signal to noise ratio is high. Once received this signal current is converted back to a signal voltage by the current sense amplifier at the receiving end of the line. Since the signal propagation time is small, the signal delay time will in practice be limited by the rise time of the signal to the gate of the source follower. Since the gate capacitance of the source follower is small this can be very fast.

Conventional methods to minimize capacitive coupling between lines have been to use low dielectric constant materials or insulators, or ground shields. In the present invention, it is desirable to use very low impedance lines it is desirable to keep the capacitive coupling between lines small and the magnitude of voltage steps on the interconnection lines small. The current step will induce a voltage step at the load which is the magnitude of the load impedance times this current step. This voltage step while small, 1 mA times Zin in this example, still can induce a capacitively coupled noise signal on an adjacent line.

FIG. 3A shows an integrated circuit 300 in which a first transmission line, strip line, or coaxial line 301A interconnects circuit components, e.g. a driver 310 to a receiver 320. FIG. 3A illustrates a first transmission line 301A over a conductive substrate 305. Conventionally, a voltage signal (i.e. a 5 volt signal swing) is provided by the driver 310 to the transmission line 301A. The schematic illustrations in FIG. 3A demonstrate that the transmission line 301A includes a small resistance, shown generally by resistor symbols 302A, 302B, . . . , 302N. Also, the transmission line 301A includes a distributed inductance (L) which is represented generally by inductor symbols 303A, 303B, . . . , 303N. In one embodiment, the driver 310 may be an inverter 310 and the receiver 320 may be an amplifier 320. Capacitor plate symbols 304 (C) are used to schematically represent the capacitive coupling which occurs between the transmission line 301A and the conducting substrate 305. In FIG. 3A, a second transmission line 301B is shown. Capacitor plate symbols 306 are used to schematically represent the capacitive coupling (Cint) which similarly occurs between the first transmission line 301A and neighboring transmission lines, e.g. second transmission line 301B.

Figure 3B:
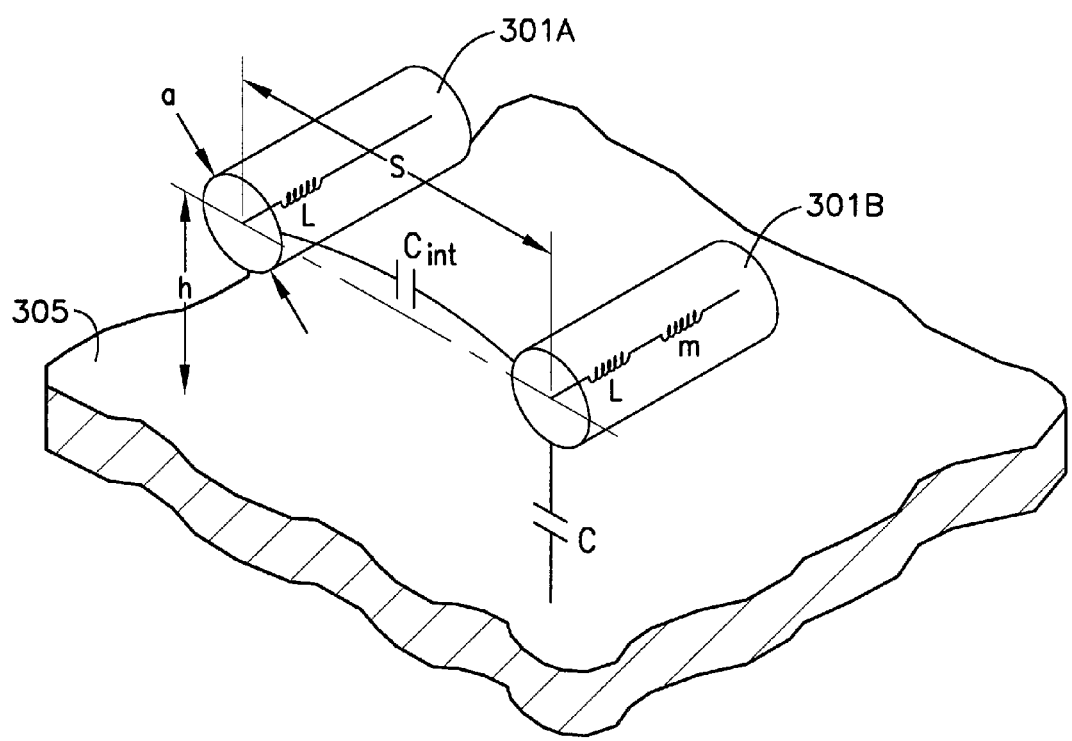
FIG. 3B illustrates two interconnection lines in close proximity and the interwire capacitance between these lines and the mutual inductance coupling between the lines.

FIG. 3B illustrates two interconnection lines in close proximity and the interwire capacitance between these lines and the mutual inductance coupling between the lines. (See generally, H. Johnson, "High-Speed Digital Circuits: A Handbook of Black Magic," Prentice-Hall, 1993; and S. Ramo, J. R. Whinnery and T. Van Duzer, "Fields and Waves in Communication Electronics, 3rd Ed.," John Wiley, New York, 1994). Although the interconnection lines on integrated circuits might tend to be more square than round, the concepts involved can be most conveniently described and formulas approximated by assuming for simplicity that the lines are round or circular. Approximate formulas have been developed describing round wires over conductive planes or two wires in close proximity, in this case they are interconnection wires on a CMOS integrated circuit, interposer, or printed circuit board.

In FIG. 3B the illustrated pair of interconnect, or transmission lines, 301A and 301B, displayed in a perspective view, are separated from a conducting substrate 305. The transmission lines, 301A and 301B are spaced a distance (h) from the conducting substrate 305 and a distance (s) from one another. The transmission lines, 301A and 301B, are shown in a circular geometry, each with a diameter (a). Some general characterizations can be made about the transmission lines, 301A and 301B, in an environment floating or suspended in air. First, each transmission line, 301A and 301B, will have a characteristic impedance in air ($Z_o$) approximately or generally given by $Z_o \approx 60 \ln(4h/a)$. Second, each transmission line, 301A and 301B, has a inductance (L) which is $L \approx 5.08 \times 10^{-9} \times \ln(4h/a)$ Henrys/inch (H/inch). Additionally, the two transmission lines, 301A and 301B, will exhibit an interwire mutual inductance (M) which is given by $M = L \times \{1/[1+(s/h)^2]\}$. Third, an interwire capacitive coupling (Cint) exists between the two transmission lines, 301A and 301B, and is expressed as $Cint = \pi \in /\cosh^{-1}(s/a)$. Using the trigonometric relationship of $\cosh^{-1}(y) \approx \ln(2y)$, the interwire capacitive coupling can similarly be expressed as $Cint \approx \pi \in /\ln(2s/a)$. Thus, in this environment, the two transmission lines, 301A and 301B, exhibit an interline capacitance (Cint) given by $Cint = \{0.7/[\ln(2 \ s/a)]\}$ pico Farads/inch (pF/inch). Lastly, each transmission line, 301A and 301B, will further exhibit capacitive coupling C with the conducting substrate 305.

Again, in FIG. 3B the transmission lines, 301A and 301B, are spaced a distance (h) from the conducting substrate 305. Using the method of images and the interwire capacitive relationship, $Cint \approx \pi \in /\ln(2 \ s/a)$, a single transmission line, 301A, over a conducting substrate is given by $C \approx 2\pi \in /\ln(4h/a)$ pF/inch where h=s/2. Thus, in this environment, the two transmission lines, 301A and 301B, exhibit a capacitance, or capacitive coupling C with the conductive substrate 305 which is $C \approx \{1.41/[\ln(4h/a)]\}$ pF/inch. The above equations have been presented by assuming that the transmission lines have round or circular geometries. Actual transmission lines on integrated circuits might tend to be more square or rectangular than round due to present lithography techniques. Nevertheless, due to the actual physical size of transmission lines, determined according to minimum lithographic feature techniques, the formulas scale well to square, rectangular or other physical cross sectional geometries for the transmission lines.

The signal rise time (trise) in conventional voltage signaling is normally slow due to the limited ability of the transmission line drivers to supply the large currents needed to charge these capacitances over large voltage swings. The signal rise times are usually much larger than the signal transmission time down the line (tprop). Additionally, if two transmission lines are in close proximity then the voltage swing on one transmission line can induce a large voltage swing or noise voltage on the adjacent transmission line. The noise voltage is determined by the capacitance ratios of interwire capacitance, Cint, to the capacitance of the transmission line with the substrate, C. In other words, the noise voltage is determined according to the ratio Cint/C.

The values of Cint and C can be comparable, dependant upon the insulator thickness (h) under the transmission lines and the spacing between the transmission lines. Emphasis in prior art is placed upon minimizing the capacitance of the transmission line, C, by using thick insulators and low dielectric constant materials. Emphasis is also to some extent placed upon minimizing the interwire capacitance, Cint. Thus, the approach in the prior art results in a noise voltage which can be a large fraction of the signal voltage if the transmission lines are in close proximity and far removed from the substrate by being over thick insulators.

Figure 4:
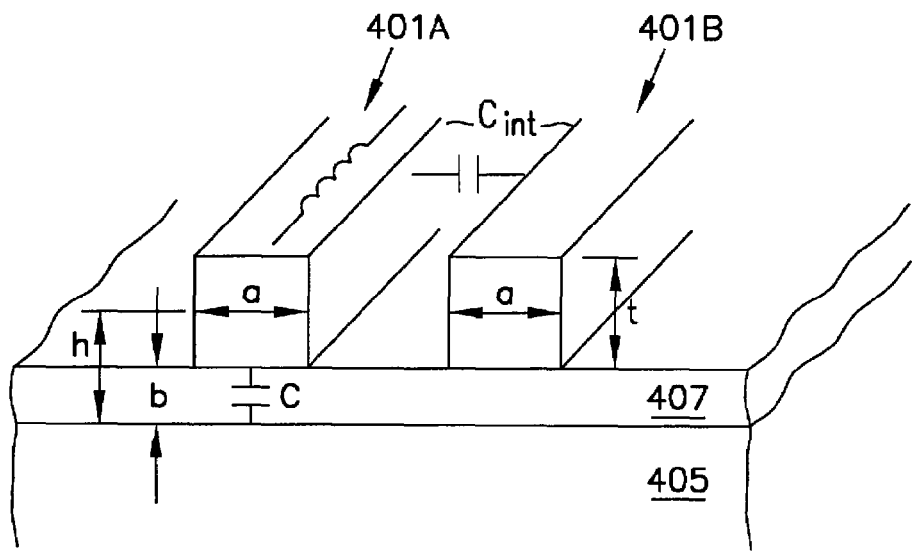
FIG. 4 is a perspective view illustrating a pair of neighboring transmission lines above a conductive substrate, according to the teachings of the present invention.

FIG. 4 is a perspective view illustrating a pair of neighboring transmission lines, 401A and 401B, above a conductive substrate 405 according to the teachings of the present invention. The present invention is designed to use current signaling across low impedance transmission lines, 401A and 401B, to reduce signal transmission delay and to improve signaling performance over longer transmission lines. Under conventional voltage signaling the current provided in the transmission lines is too weak to provide clean, accurately detectable current signal. In order to obtain better current signals in the transmission lines the signal to noise ratio of the transmission lines, 401A and 401B, must be improved.

To improve the signal to noise ratio of the transmission lines, 401A and 401B, the capacitance coupling between the transmission lines, 401A and 401B, and the conductive substrate 405, is made large. The characteristic impedance (Zo) of the transmission lines, 401A and 401B, can be expressed as $Z_o = \sqrt{L/C}$. Thus, making C large makes the characteristic impedance Zo=Zin, small and similarly makes the voltage division ratio for capacitive coupling small. In the present invention, C increases as the insulator 407 thickness (h) separating the transmission lines, 401A and 401B, from the ground plane, or substrate 405 is decreased. In FIG. 4, the transmission lines, 401A and 401B, are separated a distance (h) from the conducting substrate 405 by an insulating layer 407. In one embodiment, the insulating layer 407 is an oxide layer 407. The capacitive coupling C between the transmission lines, 401A and 401B, and the conducting substrate 405 separated by an oxide layer 407 is given as $C \approx 1.66/[\ln(4h/a)]$ pF/cm. Additionally, the inductance (L) for the transmission lines, 401A and 401B, over the oxide layer 407 is $L \approx 2 \times \ln(4h/a)$ nanoHenrys/centimeter (nH/cm). The transmission lines, 401A and 401B, are shown in a square geometry having a width (a). The insulator 407 has a thickness (b) separating the transmission lines, 401A and 401B from the substrate. 405. According to the teachings of the present invention, the insulator thickness (b) is made thinner than the thickness (t) of the transmission lines, 401A and 401B. The center of the transmission lines, 401A and 401B, are a distance (h) above the conducting substrate 405. Unlike prior art where the emphasis is placed upon on minimizing transmission line capacitance (C), the opposite is true here where the emphasis is on minimizing characteristic impedance ($Z_0$) by making the capacitance of the lines, 401A and 401B large and thus improving the signal to noise ratio.

According to the teachings of the present invention, in one embodiment the thickness (b) of the insulator is equal to or less than 1.0 micrometers (μm). In one embodiment, the thickness (t) of the transmission lines, 401A and 401B is equal to or greater than 1.0 micrometers (jim). In one embodiment, the thickness (t) of the transmission lines, 401A and 401B is approximately 1.0 (μm). In one embodiment, the width (a) of the transmission lines, 401A and 401B is approximately 1.0 micrometers (μm). As one of ordinary skill in the art will appreciate upon reading the present disclosure, one embodiment of the present invention includes transmission lines 401A and 401B formed according to the above described dimensions and separated from the substrate 405 by an insulator having a thickness (b) of less than 1.0 micrometers (μm). In one exemplary embodiment, the transmission lines 401A and 401B have an input impedance ($Z_0$) approximately equal to 50 ohms.

Figure 5:
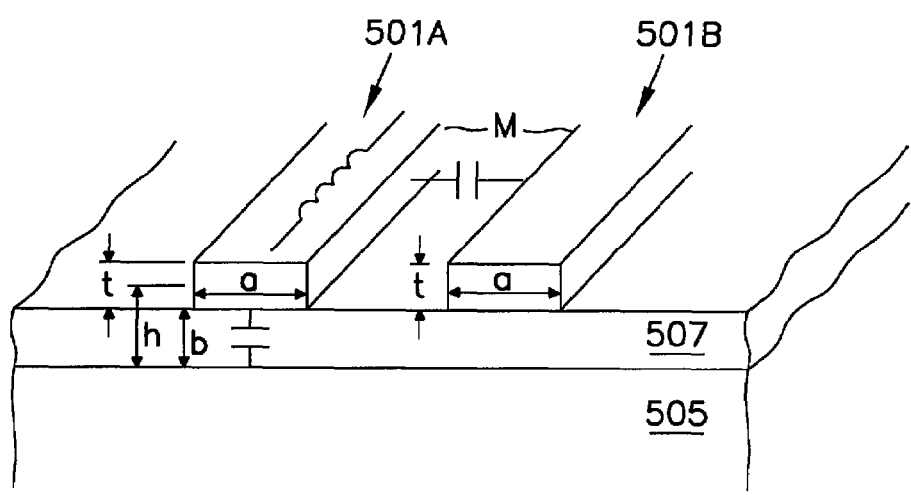
FIG. 5 is a perspective view illustrating another embodiment for a pair of neighboring transmission lines above a conductive substrate, according to the teachings of present invention.

FIG. 5 is a perspective view illustrating another embodiment for a pair of neighboring transmission lines, 501A and 501B, above a conductive substrate 505, according to the teachings of present invention. In this embodiment, a thickness (t) for each of the transmission lines, 501A and 501B, is less than the width (a) of the transmission lines, 501A and 501B. In this embodiment, the reduced thickness (t) of the transmission lines, 501A and 501B further minimizes interwire capacitive coupling (Cint). Again, as in FIG. 5C, the insulator 507 thickness (b) over the substrate 505 is made small to increase the capacitive coupling C between the transmission lines, 501A and 501B, and the substrate 505. In one embodiment, the width (a) of the transmission lines, 501A and 501B, is approximately 1.0 micrometers (μm) and the thickness (b) of the insulator layer 507 is equal to at most ¾ of the width (a) of the transmission lines, 501A and 501B. The center of the transmission lines, 501A and 501B, are a distance (h) above the conducting substrate 505. Correspondingly, the characteristic impedance Zo of the transmission lines, 501A and 501B, is reduced as Zo is dependent upon C. The transmission lines, 501A and 501B, have a low characteristic impedance ($Z_0$) and an improved signal to noise ratio. In one embodiment, the characteristic impedance Zo of the transmission lines, 501A and 501B, is approximately 30 Ohms. The current steps produced by a driver will induce a voltage step at the load which is the magnitude of the load impedance Zo times this current step. If a 1 mA current is provided to the transmission lines, 501A and 501B, a 30 mV step results on the transmission lines, 501A and 501B.

This embodiment, also results in a fast time constant (RC or ZoC) on the transmission lines, 501A and 501B. In one exemplary embodiment, each transmission line, 501A and 501B, has a length (l) of 0.1 cm or 1000 μm, each has a width (a) of approximately 1.0 μm, h is 0.68 μm, and the insulator layer thickness (b) is approximately 0.2 μm. In this embodiment, the ln(4h/a) will be approximately 1. Thus, $C \approx 1.66/[\ln(4h/a)]$ pF/cm for a line of 0.1 cm will produce $C \approx 0.2$ pF. If Zo is approximately 30 Ohms, then the time constant (ZoC) is approximately 6 pico seconds (ps). Thus, the low impedance transmission lines, 501A and 501B of the present invention keep the magnitude of the voltage steps on the transmission lines, 501A and 501B, small and the response time (tprop) rapid.

As one of ordinary skill in the art will understand upon reading this disclosure, in both embodiments of FIGS. 4 and 5 a characteristic impedance of 50 ohms on a given transmission line is easily realizable which results in a 50 mV step on one line. Thus, in the invention, the capacitance division ratio might easily be small, C=1 pF, Cint=0.06 pF, resulting in a small noise signal on an adjacent transmission line. The time constant of a second, neighboring transmission line is fast, 50 ohms times 1 pF, and 50 picoseconds. This means the noise current on the second line (Cint)×(50 mV/100 pS) or 0.03 mA. This is only a small percentage of the signal current and again the signal to noise ratio will be large. It can be shown in general the signal to noise ratio due to capacitive coupling is of the order (C/Cint)(trise/tprop); where, trise, is the rise time on the current signal and, tprop, the signal propagation time down the line.

In summary, when transmission line effects become important on integrated circuits interconnections at high switching speeds then limiting cross coupling and interconnection noise is just not simply a matter of limiting the ratio of the stray capacitance to line capacitance, Cint/C. In other words, solely using a shielding technique as shown in FIG. 2 for R-C limited lines or for low impedance lines does not always suffice. In the present invention, capacitive coupling effects can be minimized by:

(i) using low impedance lines and maximizing line capacitance to ground planes as shown in FIG. 4, and (ii) geometry, that is by making the lines wide and thin as shown in FIG. 5.

Figure 6:
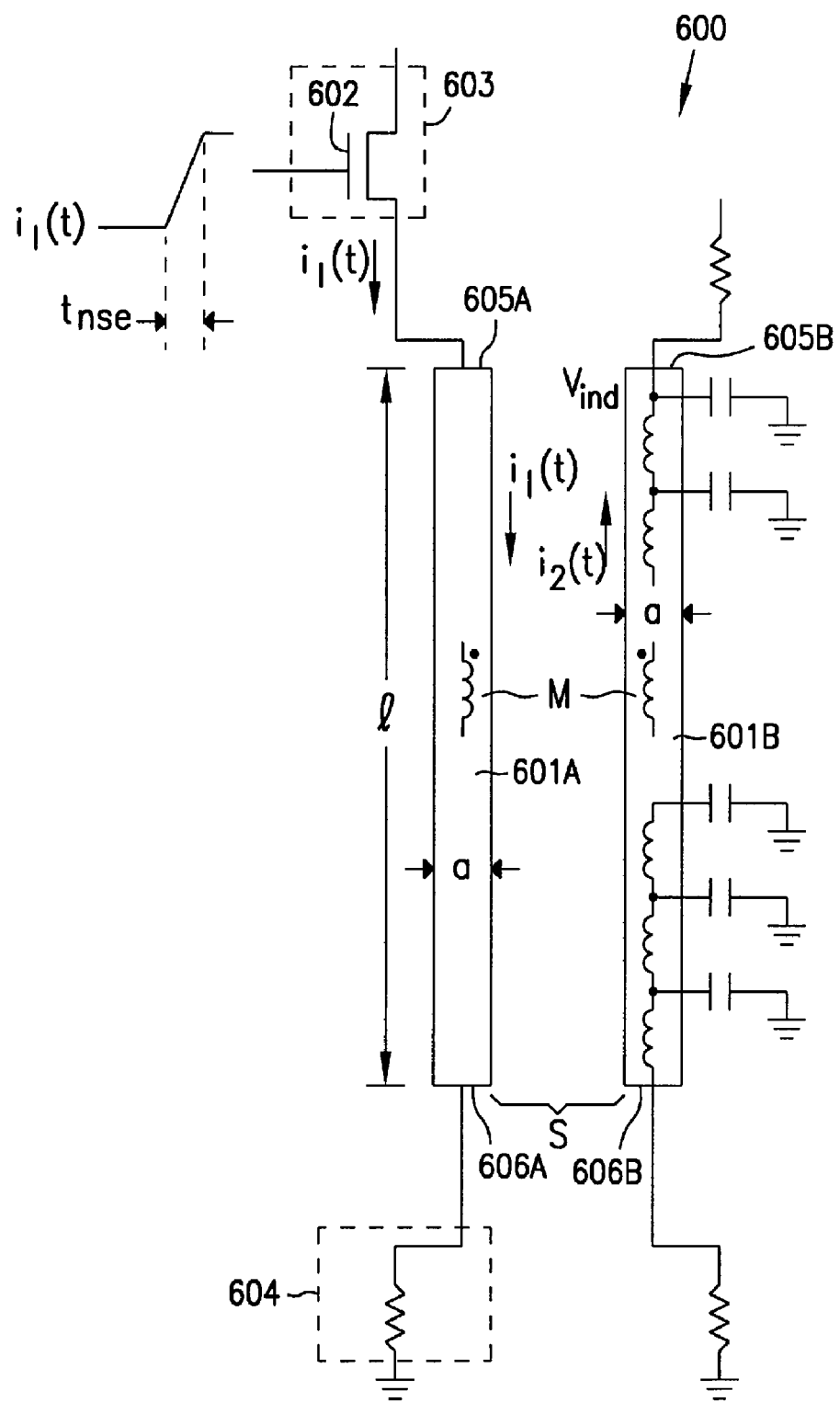
FIG. 6 is a schematic diagram for an interconnection on an integrated circuit 600 according to the teachings of the present invention.

FIG. 6 is a schematic diagram for an interconnection on an integrated circuit 600 according to the teachings of the present invention. The interconnection on the integrated circuit 600 includes a pair of transmission lines, 601A and 601B, in close proximity. The first transmission line 601A is separated by a distance (s) from the second transmission line 601B. The first transmission line 601A and the second transmission line 601B each have a first end, 605A and 605B respectively. In one embodiment, the first end 605A for the first transmission line 601A is coupled to a driver 603. The first transmission line 601A and the second transmission line 601B each have a second end, 606A and 606B respectively. In one embodiment, the second end 606A is coupled to a termination 604 formed using a complementary metal oxide semiconductor (CMOS) process.

Reference to FIG. 6 is useful in explaining the reduced amount of noise current between two transmission lines, 601A and 601B, using the current signaling technique of the present invention. In one embodiment of the present invention, transmission lines, 601A and 601B, have a low characteristic impedances Zo. In one embodiment, the input impedance (Zin) seen by the driver 603 coupling to the first transmission line 601A (in this example the "driven line") is just the characteristic impedance Zo for the first transmission line 601A. In other words, the CMOS termination 604 is impedance matched to the characteristic impedance Zo of the transmission line 601A.

In one embodiment, the first transmission line 601A is separated by approximately 3 μm from the second transmission line 601B and the transmission lines have a length (l) of at least 500 μm. In another embodiment the transmission lines, 601A and 601B, have a length (l) of at least 0.1 cm, or 1000 μm. As in FIGS. 4 and 5, the transmission lines, 601A and 601B, are separated from a conducting substrate by an insulating layer. In one embodiment, the insulating layer is an oxide layer. In this embodiment, the capacitive coupling C between the transmission lines, 601A and 601B, and the conducting substrate is given as C=1.66/[ln(4h/a)] pF/cm. In one exemplary embodiment, each transmission line, 601A and 601B, has a length (l) of 0.1 cm or 1000 μm, each has a width (a) of approximately 1.0 μm, and the insulator layer thickness (b) is approximately 0.2 μm. In this embodiment, the ln(4h/a) will be approximately 1. Thus, C≃1.66/[ln(4h/a)] pF/cm and for a line 0.1 cm long will produce a C≃0.2 pF. In the same embodiment, the inductance (L) for the transmission lines, 601A and 601B, over the oxide layer is L≃2×ln(4h/a) nH/cm, or L=0.2 nH for a line 0.1 cm long. In this embodiment, a 1 milli Ampere (mA) current step, $i_1(t)$, is applied to the gate 602 of a transistor driver 603. In one embodiment, the driver is an n-channel source follower driver 603. In this embodiment, the rise time (trise) on the gate 602 of the driver 603 is approximately 100 ps. This is the limiting time on the system response since the signal delay (tprop) down a the transmission line is proportional to $\sqrt{LC}$. For a 0.1 cm transmission line, 601A or 601B, tprop is only 7 ps. A current, $di_1(t)/dt$, of approximately $1\times10^7$ A/sec is then produced on the first transmission line 601A.

The noise current $i_2(t)$ induced on the second transmission line 601B by interwire capacitive coupling (Cint) is calculated as approximately $i_2(t)$=(Cint)×($V_1$step/trise). The interwire capacitive coupling (Cint) between the transmission lines, 601A and 601B, separated by an oxide dielectric can be expressed as Cint=0.46 pF/cm. Again, for a 0.1 cm transmission line, 601A or 601B, Cint≃0.05 pF. As described in connection with FIG. 5, a 1 mA current provided to the first transmission line 601A having a low characteristic impedance Zo of approximately 30 Ohms will result in a corresponding 30 mV Voltage step ($V_1$step) on the first transmission line 601A. Therefore, if trise is 100 ps a noise current, $i_2(t)$, of approximately 0.015 mA is produced on the second, neighboring, transmission line 601B. This noise current, $i_2(t)$, induced in the second transmission line 601B is a very small percentage, or about 1%, of the signal current $i_1(t)$ provided to the first transmission line 601A. Hence, the signal to noise ratio (SNR) will be large. It can be shown, in general, that a signal to noise ratio (SNR) for the present invention, due to capacitive coupling is of the order (C/Cint) (trise/tprop); where, trise, is the rise time for the current signal and, tprop, the signal propagation time down the first transmission line 601A. The rise time on the signal current, $i_1(t)$, in the first transmission line 601A is fast and just follows the rise time (trise) on the input signal, or 100 ps. The response time of this system utilizing current signals is thus much faster than those using voltage signals.

Reference to FIG. 6 is similarly useful to illustrate the noise voltage signal from magnetic coupling induced in the second transmission line 601B by the signal current in the first transmission line 601A. As shown in FIG. 6, a voltage will be induced in the second transmission line 601B which has a magnitude that depends on the trise, $di_1(t)/dt$, of the current $i_1(t)$ in the driven transmission line 601A, and the mutual inductance coupling (M) between neighboring transmission lines, e.g. 601A and 601B. Each transmission line, 601A and 601B, has an inductance (L). As stated above, L≃0.2 nH for a 0.1 cm transmission line, 601A and 601B. In one exemplary embodiment, the current $i_1(t)$ in the first transmission line, 601A (in this example the "driven line") rises to 1 mA in 100 ps. A current, $di_1(t)/dt$, of approximately $1\times10^7$ A/sec is then produced on the first transmission line 601A. As presented above in connection with FIGS. 3A and 3B, the mutual inductance coupling (M) can be expressed as $M=L\times\{1/[1+(s/h)^2]\}$. In one exemplary embodiment, s is approximately equal to 3 μm, and h is approximately equal to 0.7 μm. In this embodiment, M will equate to approximately M=0.02 nano Henrys (nH).

Using the relationship that the induced voltage (Vind)=M× $di_1(t)/dt$, Vind is approximately equal to 0.2 mV. During this 100 ps time period the induced voltage traveling down the second transmission line 601B just sees the characteristic impedance Zo of the second transmission line 601B. In one embodiment Zo is approximately 30 Ohms, so here, the current induced $i_2(t)$ in the second transmission line is $i_2(t)$ =Vind/Zo or 0.007 mA. This low value current is only approximately one percent (1%) of the signal current $i_1(t)$ on the first transmission line, 601A. Hence, a large signal to noise ratio (SNR) results. In contrast, under the prior technology, if high impedance capacitive loads had been used on high characteristic impedance lines and conventional voltage signaling employed there is typically a large noise voltage between the neighboring transmission lines, 601A and 601B. In the prior technology, the large noise voltage can be about one half as big as signal voltages.

The second transmission line 601B has an equivalently rapid time constant, (L/R) to that of the first transmission line 601A. In the embodiment presented above, the time constant is approximately 7 pico seconds (ps). The noise current $i_2(t)$ in the second transmission line 601B will reach a steady state in that time constant. The noise current stays at this steady state value until the end of trise, in this embodiment 100 ps, at which point $i_1(t)$ stops changing. After this, the noise current in the second line decays away very quickly. Again, when the input impedance seen by the driver 603 is matched to the characteristic impedance Zo of the first transmission line 601A, the signal to noise ratio (SNR) due to inductive coupling between the first transmission line 601A and the second, or neighboring, transmission line 601B is of the order, (L/M) (trise/tprop). In other embodiments, the actual mutual inductance and self inductances may vary from these given values without departing from the scope of the invention.

FIGS. 7A-7F illustrate an embodiment of a process of fabrication of transmission lines in an integrated circuit according to the teachings of the present invention. The sequence of the process can be followed as a method for forming integrated circuit lines and as a method for forming transmission lines in a memory device.

Figure 7A:
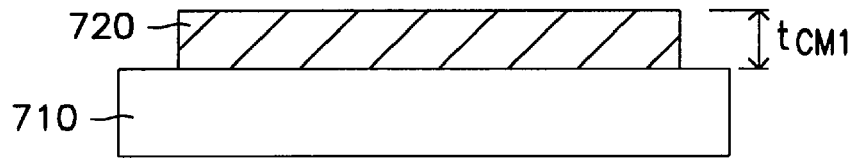
FIGS. 7A-7F illustrate an embodiment of a process of fabrication of transmission lines in an integrated circuit according to the teachings of the present invention.

FIG. 7A shows the structure after the first sequence of processing. A first layer of electrically conductive material 720 is formed on a substrate 710. The first layer of electrically conductive material 720 is formed on the substrate 710 by depositing a conducting film of high conductivity using a technique such as evaporation, sputtering or electroplating. In one embodiment, the first layer of electrically conductive material 720 is a ground plane. In an alternative embodiment, the first layer of electrically conductive material 720 is a power plane. In a further embodiment, the first layer of electrically conductive material 720 has a thickness ($t_{CM1}$) of approximately 3 to 5 micrometers (μm). In further embodiments, the first layer of electrically conductive material 720 is coupled to a power supply or a ground potential, allowing this layer to function as a direct current (DC) bus. In one embodiment, the first layer of electrically conductive material 720 includes copper. In another embodiment, the first layer of electrically conductive material 720 includes aluminum. In still another embodiment, the first layer of electrically conductive material 720 includes any other suitably conductive material. In one embodiment, the substrate 710 is a bulk semiconductor (e.g., material from the Si, SiGe and GaAs family). In an alternative embodiment, the substrate 710 is an insulator material. In another embodiment, the substrate 710 is a SOI (Silicon-On-Insulator) material.

Figure 7B:
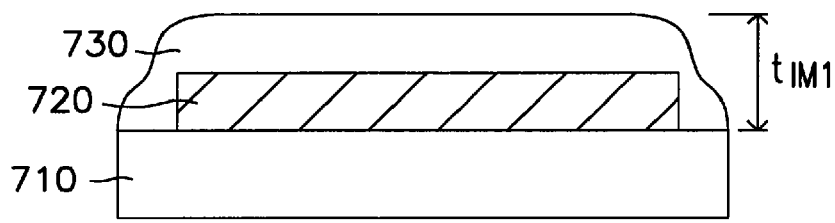

FIG. 7B illustrates the structure following the next sequence of processing. A first layer of insulating material 730 is formed on the first layer of electrically conductive material 720. In one embodiment, the first layer of insulating material 730 is formed by chemical vapor deposition (CVD). In one embodiment, the first layer of insulating material 730 is an oxide layer (e.g., $SiO_2$). In an alternative embodiment, the first layer of insulating material 730 is an insulator with having a dielectric constant equivalent to or greater that a dielectric constant of $SiO_2$. According to the teachings of the present invention, the first layer of insulating material 730 has a thickness ($t_{IM1}$) of less than 1.0 μm.

Figure 7C:
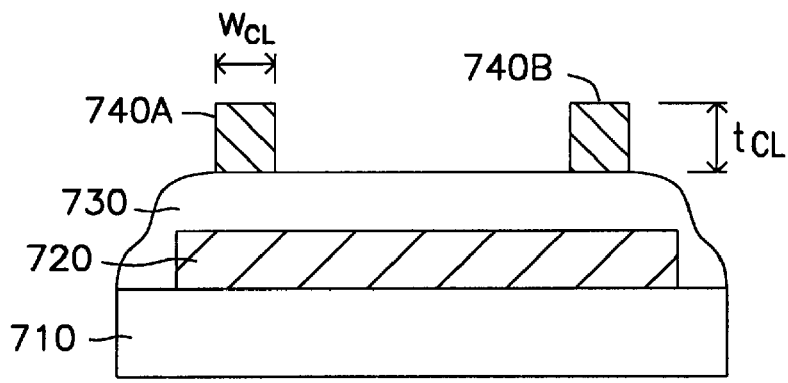

FIG. 7C illustrates the structure following the next sequence of processing. A pair of electrically conductive lines 740A and 740B are formed on the first layer of insulating material 730. In one embodiment, the pair of electrically conductive lines 740A and 740B have a width ($w_{CL}$) which is approximately equal to 1.0 micrometers (μm). However, the invention is not so limited. In one embodiment, the thickness ($t_{CL}$) of the electrically conductive lines, 740A and 740B is equal to or less than 1.0 micrometers (μm). As one of ordinary skill in the art will appreciate upon reading the present disclosure, one embodiment of the present invention includes electrically conductive lines 740A and 740B formed according to the above described dimensions and separated from the substrate by an insulator having a thickness (b) of less than 1.0 micrometers (μm). In one embodiment, the pair of electrically conductive lines 740A and 740B are formed using optical lithography followed by an additive metallization, such as lift-off evaporation or electroplating, both of which are low-temperature processing.

Figure 7D:
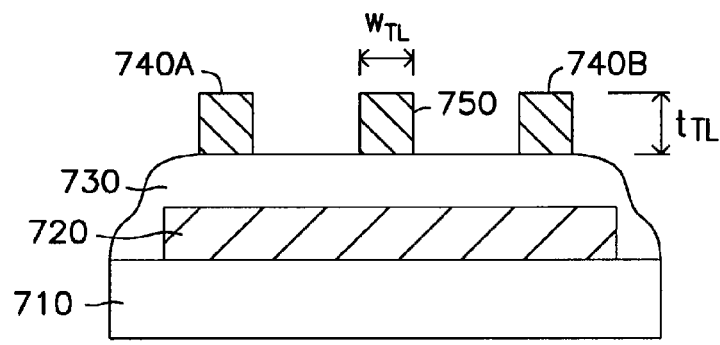

FIG. 7D illustrates the structure following the next sequence of processing. A transmission line 750 is formed on the first layer of insulating material 730. In particular, the transmission line 750 is formed between and in parallel with the pair of electrically conductive lines 740A and 740B. In one embodiment, the transmission line 750 has a width ($w_{TL}$) which is approximately equal to 1.0 micrometers (μm). However, the invention is not so limited. In one embodiment, the transmission line 750 is formed with a thickness ($t_{TL}$) of 1.0 micrometers (μm) or less. In one embodiment, the transmission line 750 is formed according to embodiments described in application Ser. No. 09/247,680, entitled "Current Mode Signal Interconnects and CMOS Amplifier," filed on Feb. 9, 1999. Similar to the processing of FIG. 7C, the transmission line 750 can be formed using optical lithography followed by an additive metallization, such as lift-off evaporation or electroplating, both of which are low-temperature processing.

Figure 7E:
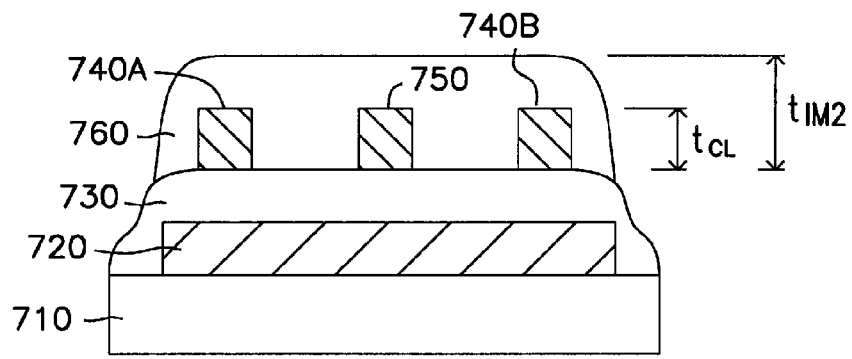

FIG. 7E illustrates the structure following the next sequence of processing. A second layer of insulating material 760 is formed on the pair of electrically conductive lines 740A and 740B and the transmission line 750. In one embodiment, the second layer of insulating material 760 is formed by chemical vapor deposition (CVD). In one embodiment, the second layer of insulating material 760 is an oxide layer (e.g., $SiO_2$). In an alternative embodiment, the second layer of insulating material 760 is an insulator having a dielectric constant which is equivalent to or greater than $SiO_2$. In yet another embodiment, the second layer of insulating material 760 is an insulator having a dielectric constant which is less than that of $SiO_2$. In one embodiment of FIG. 7E, the second layer of insulating material 760 has a thickness ($t_{IM2}$) which is at least 50% greater than a thickness ($t_{CL}$) of the pair of electrically conductive lines 740A and 740B and the transmission line 750. Advantageously, this level of thickness insures step coverage at the conductor corners.

Figure 7F:
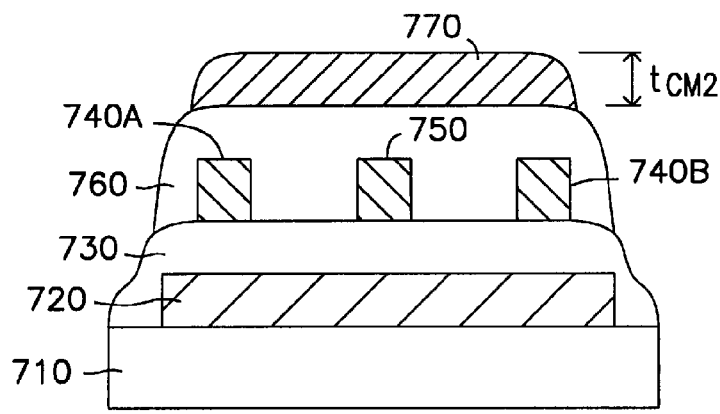

FIG. 7F illustrates the structure following the next sequence of processing. A second layer of electrically conductive material 770 is formed on the second layer of insulating material 760. The second layer of electrically conductive material 770 is formed on the second layer of insulating material 760 by depositing a conducting film of high conductivity using a technique such as evaporation, sputtering or electroplating. In one embodiment, the second layer of electrically conductive material 770 is a ground plane. In an alternative embodiment, the second layer of electrically conductive material 770 is a power plane. In a further embodiment, the second layer of electrically conductive material 770 has a thickness ($t_{CM2}$) of approximately 3 to 5 micrometers (μm). In further embodiments, the second layer of electrically conductive material 770 is coupled to a power supply or a ground potential, allowing this layer to function as a direct current (DC) bus. In one embodiment, the second layer of electrically conductive material 770 includes copper. In another embodiment, the second layer of electrically conductive material 770 includes aluminum. In still another embodiment, the second layer of electrically conductive material 770 includes any other suitably conductive material.

FIGS. 8A-8F illustrate another embodiment of a process of fabrication of transmission lines in an integrated circuit according to the teachings of the present invention. The sequence of the process can be followed as a method for forming integrated circuit lines and as a method for forming transmission lines in a memory device.

Figure 8A:
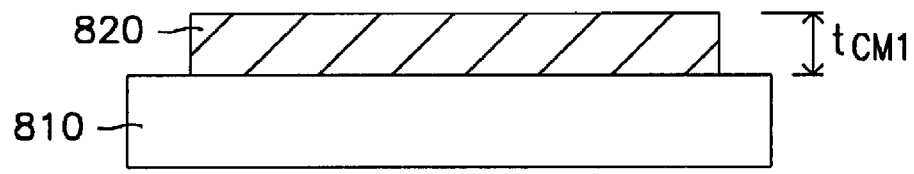
FIGS. 8A-8F illustrate another embodiment of a process of fabrication of transmission lines in an integrated circuit according to the teachings of the present invention.

FIG. 8A shows the structure after the first sequence of processing. A first layer of electrically conductive material 820 is formed on a substrate 810. The first layer of electrically conductive material 820 is formed on the substrate 810 by depositing a conducting film of high conductivity using a technique such as evaporation, sputtering or electroplating. In one embodiment, the first layer of electrically conductive material 820 is a ground plane. In an alternative embodiment, the first layer of electrically conductive material 820 is a power plane. In a further embodiment, the first layer of electrically conductive material 820 has a thickness ($t_{CM1}$) of approximately 3 to 5 micrometers (μm). In further embodiments, the first layer of electrically conductive material 820 is coupled to a power supply or a ground potential, allowing this layer to function as a direct current (DC) bus. In one embodiment, the first layer of electrically conductive material 820 includes copper. In another embodiment, the first layer of electrically conductive material 820 includes aluminum. In still another embodiment, the first layer of electrically conductive material 820 includes any other suitably conductive material. In one embodiment, the substrate 810 is a bulk semiconductor (e.g., material from the Si, SiGe and GaAs family). In an alternative embodiment, the substrate 810 is an insulator material. In another embodiment, the substrate 810 is a SOI (Silicon-On-Insulator) material.

Figure 8B:
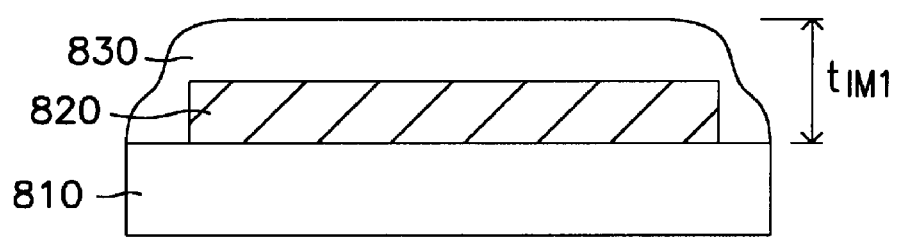

FIG. 8B illustrates the structure following the next sequence of processing. A first layer of insulating material 830 is formed on the first layer of electrically conductive material 820. In one embodiment, the first layer of insulating material 830 is formed by chemical vapor deposition (CVD). In one embodiment, the first layer of insulating material 830 is an oxide layer (e.g., $SiO_2$). In an alternative embodiment, the first layer of insulating material 830 is an insulator having a dielectric constant which is equivalent to or greater than $SiO_2$. According to the teachings of the present invention, the first layer of insulating material 830 has a thickness ($t_{IM1}$) of less than 1 µm.

Figure 8C:
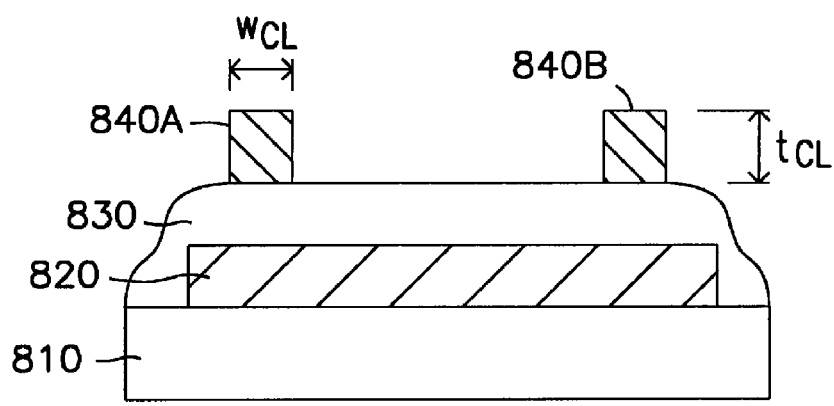

FIG. 8C illustrates the structure following the next sequence of processing. A pair of electrically conductive lines 840A and 840B are formed on the first layer of insulating material 830. In one embodiment, the pair of electrically conductive lines 840A and 840B have a width ($w_{CL}$) which is approximately equal to 1.0 micrometers (µm). However, the invention is not so limited. In one embodiment, the width ($w_{CL}$) of the electrically conductive lines, 840A and 840B is approximately 1.0 micrometers (µm). As one of ordinary skill in the art will appreciate upon reading the present disclosure, one embodiment of the present invention includes electrically conductive lines 840A and 840B formed according to the above described dimensions and separated from the substrate by an insulator having a thickness (b) of less than 1.0 micrometers (µm). In one embodiment, the pair of electrically conductive lines 840A and 840B are formed using optical lithography followed by an additive metallization, such as lift-off evaporation or electroplating, both of which are low-temperature processing.

Figure 8D:
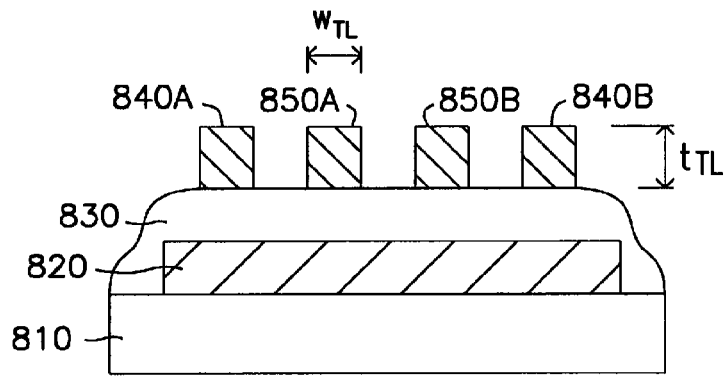

FIG. 8D illustrates the structure following the next sequence of processing. A pair of transmission lines 850A and 850B are formed on the first layer of insulating material 830. In particular, the pair of transmission lines 850A and 850B are formed between and parallel with the pair of electrically conductive lines 840A and 840B. In one embodiment, the pair of transmission lines 850A and 850B have a width ($w_{TL}$) which is approximately equal to 1.0 micrometers (µm). However, the invention is not so limited. In one embodiment, the pair of transmission lines 850A and 850B are formed with a thickness ($t_{TL}$) equal to 1.0 micrometers (µm) or less. In one embodiment, the pair of transmission lines 850A and 850B are formed according to embodiments described in application Ser. No. 09/247,680, entitled "Current Mode Signal Interconnects and CMOS Amplifier," filed on Feb. 9, 1999. Similar to the processing of FIG. 8C, the pair of transmission lines 850A and 850B can be formed using optical lithography followed by an additive metallization, such as lift-off evaporation or electroplating, both of which are low-temperature processing.

Figure 8E:
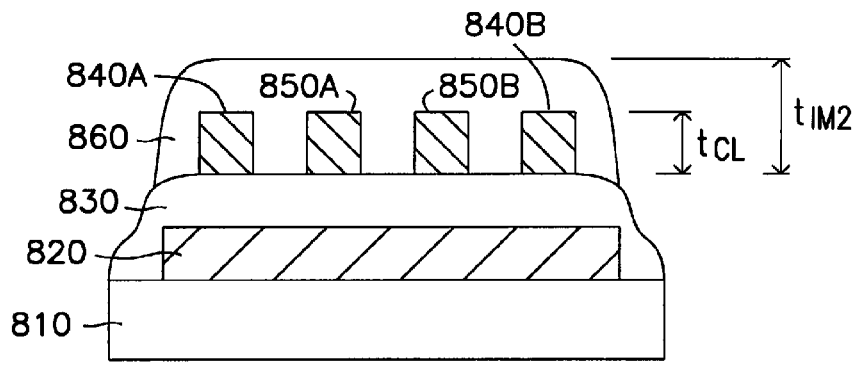

FIG. 8E illustrates the structure following the next sequence of processing. A second layer of insulating material 860 is formed on the pair of electrically conductive lines 840A and 840B and the pair of transmission lines 850A and 850B. In one embodiment, the second layer of insulating material 860 is formed by chemical vapor deposition (CVD). In one embodiment, the second layer of insulating material 860 is an oxide layer (e.g., $SiO_2$). In an alternative embodiment, the second layer of insulating material 860 is an insulator having a dielectric constant which is equivalent to or greater than $SiO_2$. In yet another embodiment, the second layer of insulating material 860 is an insulator having a dielectric constant which is less than that of $SiO_2$. In one embodiment of FIG. 8E, the second layer of insulating material 860 has a thickness ($t_{IM2}$) which is at least 50% greater than a thickness ($t_{CL}$) of the pair of electrically conductive lines 840A and 840B and the pair of transmission lines 850A and 850B. Advantageously, this level of thickness insures step coverage at the conductor corners.

Figure 8F:
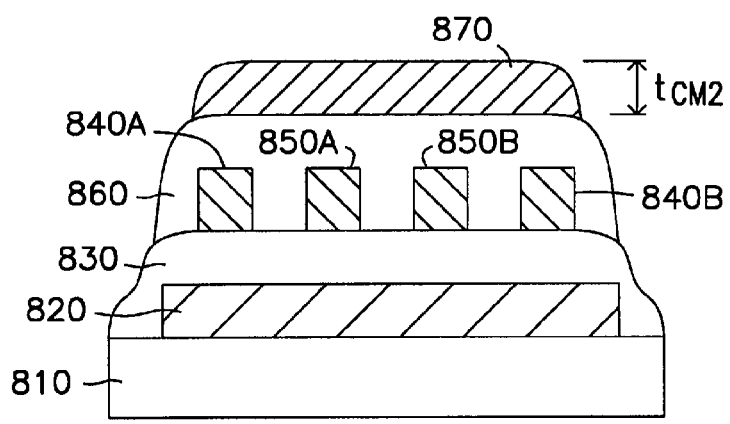

FIG. 8F illustrates the structure following the next sequence of processing. A second layer of electrically conductive material 870 is formed on the second layer of insulating material 860. The second layer of electrically conductive material 870 is formed on the second layer of insulating material 860 by depositing a conducting film of high conductivity using a technique such as evaporation, sputtering or electroplating. In one embodiment, the second layer of electrically conductive material 870 is a ground plane. In an alternative embodiment, the second layer of electrically conductive material 870 is a power plane. In a further embodiment, the second layer of electrically conductive material 870 has a thickness ($t_{CM2}$) of approximately 3 to 5 micrometers (µm). In further embodiments, the second layer of electrically conductive material 870 is coupled to a power supply or a ground potential, allowing this layer to function as a direct current (DC) bus. In one embodiment, the second layer of electrically conductive material 870 includes copper. In another embodiment, the second layer of electrically conductive material 870 includes aluminum. In still another embodiment, the second layer of electrically conductive material 870 includes any other suitably conductive material.

Figure 9:
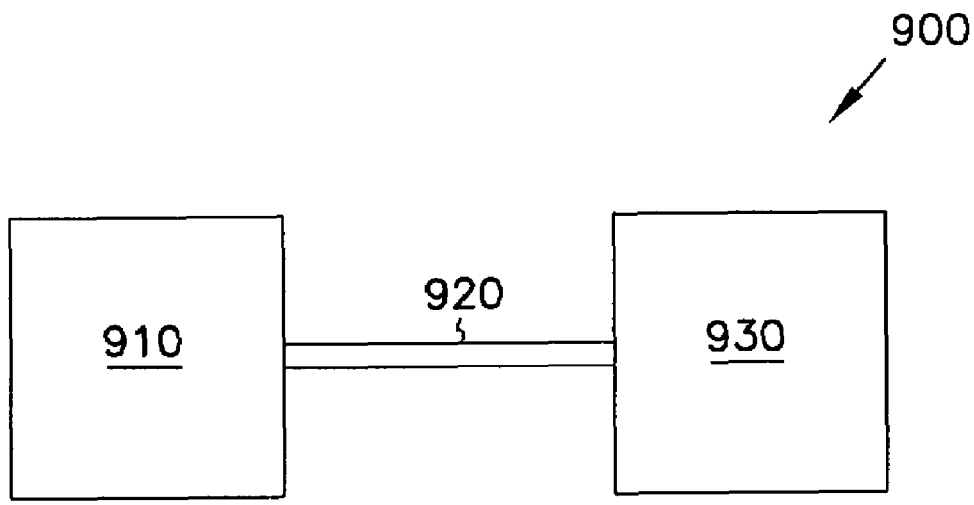
FIG. 9 is a block diagram which illustrates an embodiment of a system using line signaling according to teachings of the present invention.

FIG. 9 is a block diagram which illustrates an embodiment of a system 900 using line signaling according to teachings of the present invention. The system 900 includes a low output impedance driver 910 having a driver impedance, as is well known in the art. The low output impedance driver 910 is coupled to a transmission line circuit 920. Embodiments of the transmission line circuit 920 are described and presented above with reference to FIGS. 3-8. Moreover, the system 900 includes a termination circuit 930 having a termination impedance that is matched to the impedance of the transmission line circuit 920.

Figure 10:
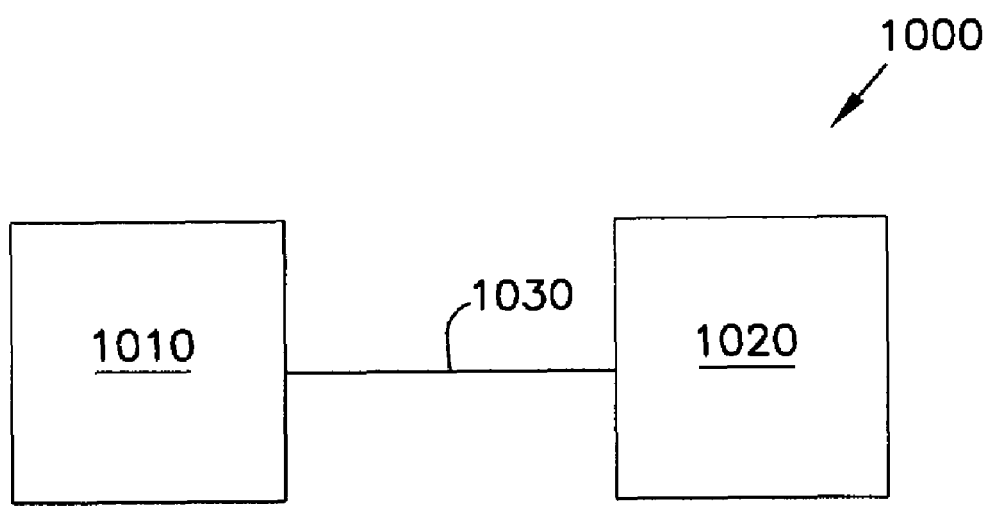
FIG. 10 is a block diagram which illustrates another embodiment of a system according to teaching of the present invention.

FIG. 10 is a block diagram which illustrates an embodiment of a system 1000 according to teaching of the present invention. The system 1000 includes an integrated circuit 1010. The integrated circuit 1010 includes the transmission line circuit described and presented above with reference to FIGS. 3-8. Additionally, the system 1000 includes a processor 1020 that is operatively coupled to the integrated circuit 1010. The processor 1020 is coupled to the integrated circuit 1010 through a system bus 1030. In one embodiment, the processor 1020 and the integrated circuit 1010 are on the same semiconductor chip.

CONCLUSION

Thus, improved methods and structures are provided using capacitive techniques to reduce noise in high speed interconnections, such as those used in CMOS integrated circuits. The present invention also offers a reduction in signal delay. Moreover, the present invention further provides a reduction in skew and crosstalk. Embodiments of the present invention also provide the fabrication of improved transmission lines for silicon-based integrated circuits using conventional CMOS fabrication techniques.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An electronic system comprising:
a processor; and
an integrated circuit coupled to the processor, the integrated circuit having a transmission line circuit including:
a layer of electrically conductive material disposed on a substrate;
a layer of an insulating material disposed on the layer of electrically conductive material, the layer of insulating material having a thickness of less than 1.0 micrometer ($\mu m$);
current signaling circuitry having a current sense amplifier; and
a transmission line coupled to the current sense amplifier and arranged to provide current signaling, the transmission line disposed on and contacting the layer of insulating material such that the transmission line is separated from the layer of electrically conductive material by the thickness of the layer of insulating material, the transmission line having a geometry such that the geometry and the thickness of the layer of the insulating material limit noise current in the transmission line.

2. The electronic system of claim 1, wherein the transmission line has a thickness of approximately 1.0 $\mu m$.

3. The electronic system of claim 1, wherein the transmission line has a thickness greater than 1.0 $\mu m$.

4. The electronic system of claim 1, wherein the transmission line has a thickness less than 1.0 $\mu m$ and the layer of insulating material has a thickness less than the thickness of the transmission line.

5. The electronic system of claim 1, wherein the transmission line has a width of approximately 1.0 $\mu m$.

6. The electronic system of claim 1, wherein the integrated circuit includes a driver circuit coupled to the transmission line such that the driver has an input impedance substantially equal to that of the characteristic impedance of the transmission line.

7. The electronic system of claim 1, wherein the layer of electrically conductive material is a ground plane.

8. The electronic system of claim 1, wherein the processor and the integrated circuit are disposed on a common semiconductor chip.

9. An electronic system comprising:
a processor; and
an integrated circuit coupled to the processor, the integrated circuit having a transmission line circuit including:
a bottom layer of electrically conductive material disposed on a substrate;
a layer of insulating material disposed on the bottom layer of electrically conductive material, the layer of insulating material having a thickness of less than 1.0 micrometer ($\mu m$);
a pair of electrically conductive lines disposed on the layer of insulating material;
current signaling circuitry having a current sense amplifier;
a transmission line coupled to the current sense amplifier and arranged to provide current signaling, the transmission line disposed on and contacting the layer of insulating material such that the transmission line is separated from the bottom layer of electrically conductive material by the thickness of the layer of insulating material, the transmission line having a geometry such that the geometry and the thickness of the layer of the insulating material limit noise current in the transmission line, the transmission line disposed between and parallel with the pair of electrically conductive lines; and
a top layer of electrically conductive material disposed on the layer of insulating material.

10. The electronic system of claim 9, wherein the layer of insulating material includes oxide.

11. The electronic system of claim 9, wherein the top and bottom layers of electrically conductive material have a thickness of approximately 3 to 5 micrometers ($\mu m$).

12. The electronic system of claim 9, wherein the top layer of electrically conductive material is coupled to a power supply.

13. The electronic system of claim 9, wherein the substrate includes an insulator material.

14. The electronic system of claim 9, wherein the pair of electrically conductive lines and the transmission line have a width and a thickness of approximately 1.0 $\mu m$.

15. The electronic system of claim 9, wherein the pair of electrically conductive lines and the transmission line have a thickness of less than 1.0 $\mu m$.

16. The electronic system of claim 9, wherein the integrated circuit includes a memory.

17. The electronic system of claim 9, wherein the processor and the integrated circuit are on a common semiconductor chip.

18. An electronic system comprising:
a processor; and
an integrated circuit coupled to the processor, the integrated circuit having a transmission line circuit including:
a bottom layer of electrically conductive material disposed on a substrate;
a layer of insulating material disposed on the bottom layer of electrically conductive material, the layer of insulating material having a thickness of less than 1.0 micrometer ($\mu m$);
a pair of electrically conductive lines disposed on the layer of insulating material;
current signaling circuitry having current sense amplifiers; and
a pair of transmission lines coupled to respective ones of the current sense amplifiers and arranged to provide current signaling, the pair of transmission lines disposed on and contacting the layer of insulating material such that the pair of transmission lines is separated from the bottom layer of electrically conductive material by the thickness of the layer of insulating material, each of the pair of transmission lines having a geometry such that the geometry and the thickness of the layer of the insulating material limit noise current in each of the pair of transmission lines, the pair of transmission lines disposed between and parallel with the pair of electrically conductive lines.

19. The electronic system of claim 18, wherein the pair of transmission lines includes a pair of differential signal lines.

20. The electronic system of claim 18, wherein the bottom layer of electrically conductive material includes a ground plane.

21. The electronic system of claim 18, wherein the bottom layer of electrically conductive material has a thickness of approximately 3 to 5 micrometers (μm).

22. The electronic system of claim 18, wherein the electrically conductive lines and the transmission lines each have a width and a thickness of approximately 1.0 μm.

23. The electronic system of claim 18, wherein the electrically conductive lines and the transmission lines have a thickness of less than 1.0 μm.

24. The electronic system of claim 18, wherein transmission line circuit has a dielectric layer disposed on the pair of electrically conductive lines and on the pair of transmission lines.

25. The electronic system of claim 18, wherein the processor and the integrated circuit are disposed on a common semiconductor chip.

26. The electronic system of claim 19, wherein a first end of each of the pair of differential signal lines is coupled to a low output impedance driver having a driver impedance and a second end of each of the pair of differential signal lines is coupled to a termination circuit having a termination impedance that is matched to the driver impedance.

27. The electronic system of claim 24, wherein the dielectric layer and the layer of insulating material have a common composition.

28. The electronic system of claim 24, wherein the dielectric layer includes a composition having a dielectric constant different from that of the layer of insulating material.

29. The electronic system of claim 24, wherein each of the transmission lines have a thickness and each of the electrically conductive lines have a thickness such that each transmission line and each electrically conductive line have substantially the same thickness and the dielectric layer has a thickness equal to or greater than 50% larger than the thickness of the transmission line.

30. The electronic system of claim 24, wherein the integrated circuit has a conductive plane disposed on the dielectric layer.

31. The electronic system of claim 28, wherein the layer of insulating material includes silicon oxide.

32. The electronic system of claim 30, wherein the conductive plane includes a power plane.

* * * * *